United States Patent
Hara et al.

(10) Patent No.: US 8,071,496 B2
(45) Date of Patent: Dec. 6, 2011

(54) SILICON NITRIDE-MELILITE COMPOSITE SINTERED BODY AND DEVICE UTILIZING THE SAME

(75) Inventors: Yasushi Hara, Ichinomiya (JP); Tetsuya Maeda, Konan (JP); Akifumi Tosa, Komaki (JP); Takenori Sawamura, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 99 days.

(21) Appl. No.: 12/616,514

(22) Filed: Nov. 11, 2009

(65) Prior Publication Data
US 2010/0130345 A1    May 27, 2010

(30) Foreign Application Priority Data

Nov. 21, 2008  (JP) ................................ 2008-298032
Sep. 18, 2009  (JP) ................................ 2009-216741

(51) Int. Cl.
*C04B 35/587* (2006.01)
*G01R 31/26* (2006.01)

(52) U.S. Cl. ................ 501/97.2; 324/762.01; 324/754.1
(58) Field of Classification Search ................. 501/97.2; 324/762.01, 754.1
See application file for complete search history.

(56) References Cited

U.S. PATENT DOCUMENTS 7,642,209 B2 *   1/2010  Okawa et al. ............... 501/97.1
7,829,491 B2 *  11/2010  Oda ............................ 501/98.2

FOREIGN PATENT DOCUMENTS

| JP | 61155262    | * | 7/1986  |
| JP | 6-287063    | A | 10/1994 |
| JP | 10-139550   | A | 5/1998  |
| JP | 2002128567  | A | 5/2002  |
| JP | 2002-257853 | A | 9/2002  |

* cited by examiner

*Primary Examiner* — Karl Group
(74) *Attorney, Agent, or Firm* — Sughrue Mion, PLLC

(57) ABSTRACT

A silicon nitride-melilite composite sintered body in accordance with the invention includes silicon nitride and a melilite $Me_2Si_3O_3N_4$, where Me denotes a metal element combining with silicon nitride to generate the melilite. The silicon nitride-melilite composite sintered body contains Si in a range of 41 to 83 mole percent in $Si_3N_4$ equivalent and Me in a range of 13 to 50 mole percent in oxide equivalent. The silicon nitride-melilite composite sintered body has an average thermal expansion coefficient that is arbitrarily adjustable in a range of 2 to 6 ppm/K at temperatures of 23 to 150° C. The silicon nitride-melilite composite sintered body has a high Young's modulus, a high mechanical strength, and excellent sintering performance. A device used for inspection of semiconductor in accordance with the invention utilizes such a silicon nitride-melilite composite sintered body.

14 Claims, 3 Drawing Sheets

500MPa

530MPa

630MPa

640MPa

SILICON NITRIDE-MELILITE COMPOSITE SINTERED BODY AND DEVICE UTILIZING THE SAME

CROSS REFERENCE TO RELATED APPLICATIONS

The present application claims the priority based on Japanese Patent Application No. 2008-298032 filed on Nov. 21, 2008 and No. 2009-216741 filed on Sep. 18, 2009, the disclosure of which is hereby incorporated by reference in its entirety.

BACKGROUND

1. Technical Field

The present invention relates to a silicon nitride-melilite composite sintered body effectively applicable as a structural material of a semiconductor inspection device, such as a probe card, as well as to a device, such as a probe card, utilizing such a silicon nitride-melilite composite sintered body.

2. Description of the Related Art

In the process of manufacturing semiconductor chips, a semiconductor inspection device, for example, a probe card, is generally used to check for the normal operations of an integrated circuit formed on each silicon wafer or semiconductor wafer. The probe card typically has a large number of needle-like probe terminals provided on a lower face of a ceramic substrate made of, for example, alumina. The probe terminals are brought into contact with terminal pads of the semiconductor wafer. The semiconductor wafer is checked for conduction of the integrated circuit and insulation between respective circuits by application of electric current.

The inspection of the operating conditions of the integrated circuit formed on the semiconductor wafer may be required not only at ordinary temperature but in a high temperature condition of not lower than 100° C. (for example, 150° C.). In the latter case, the probe card is required to quickly increase its temperature with a temperature increase of the semiconductor wafer and have a practically equivalent behavior of thermal expansion to that of the semiconductor wafer. The different behaviors of thermal expansion may cause poor contact of the probe terminals of the probe card with the terminal pads of the semiconductor wafer. There is accordingly a high demand for a probe card having a practically equivalent thermal expansion coefficient to that of the semiconductor wafer and a ceramic material used to manufacture such a probe card. The desired ceramic material accordingly has a sufficiently high mechanical strength and an average thermal expansion coefficient that is arbitrarily adjustable in a range of 2 to 6 ppm/K or more preferably in a range of 3 to 5 ppm/K according to the demand characteristics of the device in a temperature range from room temperature (e.g., 23° C.) to 150° C.

One proposed probe card utilizes a ceramic substrate made of a non-oxide ceramic material, such as aluminum nitride or silicon nitride, to allow for inspection of integrated circuits in the high temperature condition. This prior art probe card has excellent thermal conductivity but only a substantially fixed thermal expansion coefficient. For example, in the case of application of aluminum nitride as the ceramic material, the thermal expansion coefficient of the probe card is approximately 4 ppm/K, which is relatively close to the thermal expansion coefficient of the semiconductor wafer but is not adjustable to another arbitrary value. Namely this prior art technique does not fulfill the recent high demand for the probe card. In the case of application of silicon nitride as the ceramic material the thermal expansion coefficient of the probe card is undesirably low as 2 ppm/K or below. Alumina widely used as an oxide ceramic material of the ceramic substrate, on the other hand, has an undesirably high thermal expansion coefficient of about 6 ppm/K or above.

The ceramic material having the sufficiently high mechanical strength and the average thermal expansion coefficient that is arbitrarily adjustable in the range of 2 to 6 ppm/K in the temperature range from room temperature to 150° C. is highly demanded for the probe card or another equivalent device used for inspection of semiconductor wafers.

One proposed example of the silicon nitride-based ceramic material has a thermal expansion coefficient in a range of 3.5 to 4.1 ppm/K, which practically satisfies the above condition of the average thermal expansion coefficient in the range of 2 to 6 ppm/K. This prior art silicon nitride-based ceramic material, however, does not have a sufficiently high Young's modulus, which is lately required for large-scaled ceramic substrates.

As a result of the intensive studies and researches for development of a ceramic material satisfying the diverse conditions mentioned above, the inventors of the present invention have found that composing silicon nitride and a melilite at a specific composition gives a composite sintered body having a high mechanical strength, a high Young's modulus, and excellent sintering performance or production stability, as well as an average thermal expansion coefficient arbitrarily adjustable to the above range of 2 to 6 ppm/K in the temperature range from room temperature to 150° C.

SUMMARY

Based on the findings explained above, there would be a need for providing a silicon nitride-melilite composite sintered body that is effectively applicable to a probe card used for inspection of semiconductor wafers and has a high mechanical strength, a high Young's modulus, and excellent sintering performance, as well as an average thermal expansion coefficient arbitrarily adjustable in a range of 2 to 6 ppm/K or more specifically in a range of 3 to 5 ppm/K at temperatures of 23° C. to 150° C. There would also be another need for providing a semiconductor inspection device, such as a probe card, that utilizes such a silicon nitride-melilite composite sintered body and ensures inspection of semiconductor with high reliability.

The present invention addresses at least part of the demands mentioned above and the other relevant demands by a silicon nitride-melilite composite sintered body having any of the configurations and arrangements discussed below, as well as by a device utilizing such a silicon nitride-melilite composite sintered body.

According to one aspect, the invention is directed to a silicon nitride-melilite composite sintered body, which includes silicon nitride crystalline phases, melilite crystalline phases of $Me_2Si_3O_3N_4$, and grain boundary phases. Here Me denotes a metal element combining with silicon nitride to generate a melilite. A ratio of the melilite crystalline phases is not less than 20% on a cutting plane of the silicon nitride-melilite composite sintered body.

The silicon nitride-melilite composite sintered body according to this aspect of the invention has an arbitrarily adjustable average thermal expansion coefficient by composing the silicon nitride crystalline phases with a relatively low thermal expansion coefficient (about 2 ppm/K or below) and the melilite crystalline phases with a relatively high thermal expansion coefficient (about 6 ppm/K or above). The ratio of the melilite crystalline phases, which have a higher Young's modulus than that of glass phases, is set to be not less than 20% on the cutting plane of the silicon nitride-melilite composite sintered body. This ensures the sufficiently high Young's modulus of the silicon nitride-melilite composite sintered body. The glass phases are a non-crystallized but vitrified portion of the grain boundary phases.

The silicon nitride-melilite composite sintered body according to the above aspect of the invention is effectively applicable to the probe card used for inspection of semiconductor wafers and has the high mechanical strength, the high Young's modulus, and the excellent sintering performance, as well as the average thermal expansion coefficient in the range of 2 to 6 ppm/K at the temperatures of 23° C. to 150° C. The silicon nitride-melilite composite sintered body of the invention is effectively applicable to a semiconductor inspection device to ensure inspection of semiconductor with the high reliability and is also applicable to a semiconductor production device to ensure production of semiconductor with the high reliability.

According to another aspect, the invention is also directed to a device that is used for inspection or production of semiconductor and includes a member utilizing the silicon nitride-melilite composite sintered body discussed above.

The device according to this aspect of the invention ensures the highly reliable inspection or production of an object having the average thermal expansion coefficient in the range of 2 to 6 ppm/K at the temperatures of 23 to 150° C.

DESCRIPTION OF THE PREFERRED EMBODIMENTS

Figure 1A:
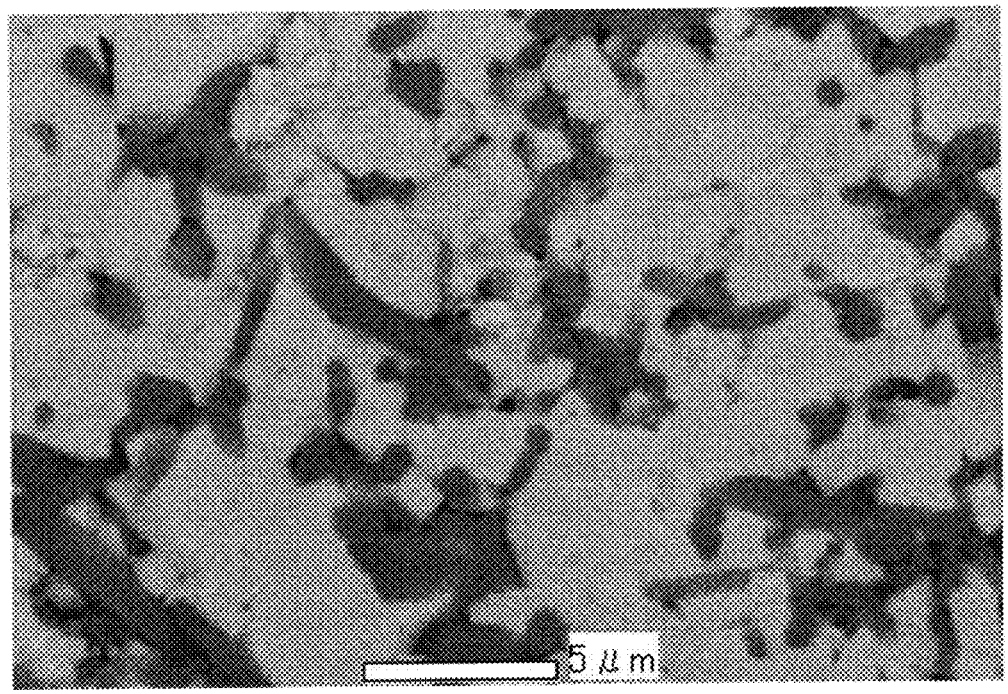
FIG. 1A is an electron micrograph by SEM imaging of one example of a silicon nitride-melilite composite sintered body in accordance with the invention.

Some modes of carrying out the invention are described below as preferred embodiments with reference to the accompanied drawings.

A silicon nitride-melilite composite sintered body according to one embodiment of the present invention (hereafter referred to as 'the present embodiment') includes silicon nitride crystalline phases, melilite crystalline phases of $Me_2Si_3O_3N_4$, and grain boundary phases. Here 'Me' denotes a metal element combining with silicon nitride to generate a melilite. The melilite crystalline phases have a crystalline structure substantially equivalent to the crystalline structure of $Y_2Si_3O_3N_4$. Strictly speaking, the melilite crystalline phases may have the ratio Y:Si:O:N that is slightly deviated from a ratio 2:3:3:4 and may further contain one or multiple additives incorporated in the crystalline structure.

In the silicon nitride-melilite composite sintered body of the present embodiment, a ratio of the melilite crystalline phases is not less than 20% on a cutting plane of the composite sintered body. In the silicon nitride-melilite composite sintered body of the present embodiment, a water absorption rate is not higher than 1.5%, and a sum of the ratio of the melilite crystalline phases and a ratio of the silicon nitride crystalline phases is not less than 80% on the cutting plane of the composite sintered body.

The silicon nitride-melilite composite sintered body of the present embodiment contains Si in a range of 41 to 83 mole percent in $Si_3N_4$ equivalent and Me in a range of 13 to 50 mole percent in oxide equivalent. The method of measuring and converting the contents of Si and Me in the present embodiment dissolves the silicon nitride-melilite composite sintered body, measures the fractions of the respective elements other than O (oxygen) and N (nitrogen) by ICP (instrument calibration procedure), and converts the Si fraction into the $Si_3N_4$ equivalent and the non-Si fractions into the oxide equivalents (for example, $Y_2O_3$, SrO, and $Al_2O_3$) to calculate the content ratios of the respective elements relative to the total content of 100 mole percent.

Typical examples of the metal element Me combining with silicon nitride to generate the melilite are group 3 elements Y (yttrium), Sc (scandium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), Lu (lutetium), Ac (actinium), Th (thorium), Pa (protactinium), U (uranium), Np (neptunium), Pu (plutonium), Am (americium), Cm (curium), Bk (berkelium), Cf (californium), Es (einsteinium), Fm (fermium), Md (mendelevium), No (nobelium), and Lr (lawrencium). From the standpoints of the material cost and the productivity of the melilite, among these group 3 elements, Y, Nd, Sm, Gd, Dy, Er, and Yb are specifically preferable, and Y is most preferable.

When the content of Si is less than the above range in $Si_3N_4$ equivalent, the resulting silicon nitride-melilite composite sintered body has the undesirably high thermal expansion coefficient that is similar to the thermal expansion coefficient of alumina. When the content of Si is greater than the above range in $Si_3N_4$ equivalent, on the other hand, generation of the melilite is interfered or prevented and the resulting silicon nitride-melilite composite sintered body has the undesirably low thermal expansion coefficient that is similar to the thermal expansion coefficient of silicon nitride. When the content of the metal element Me combining silicon nitrite to generate the melilite is less than the above range in oxide equivalent, generation of the melilite is interfered or prevented and the resulting silicon nitride-melilite composite sintered body has the undesirably low thermal expansion coefficient that is not significantly different from the thermal expansion coefficient of silicon nitride. When the content of the metal element Me is greater than the above range in oxide equivalent, on the other hand, the resulting silicon nitride-melilite composite sintered body has the undesirably high thermal expansion coefficient that is not significantly different from the thermal expansion coefficient of alumina. When the content of one or multiple additives is greater than the above range in oxide equivalent, the resulting silicon nitride-melilite composite sintered body has the undesirably lowered mechanical strength or lowered Young's modulus.

The complex compounds of $Me_2O_3$ and $Si_3N_4$ include not only the melilite $Me_2Si_3O_3N_4$ as a 1:1 compound of $Me_2O_3$ and $Si_3N_4$ but $Me_2O_3 \cdot 2Si_3N_4$ as a 1:2 compound of $Me_2O_3$ and $Si_3N_4$, $Me_2O_3 \cdot 3Si_3N_4$ as a 1:3 compound of $Me_2O_3$ and $Si_3N_4$, and $2Me_2O_3 \cdot 3Si_3N_4$ as a 2:3 compound of $Me_2O_3$ and $Si_3N_4$. The silicon nitride-melilite composite sintered body of the invention may contain any of these complex compounds.

The additive used in the present invention is at least one element selected among group 2 elements, La, Ce, and Pr. In the case of (A) using at least one element selected among group 2 elements including Be (beryllium), Mg (magnesium), Ca (calcium), Sr (strontium), Ba (barium), and Ra (radium) as the additive, the resulting silicon nitride-melilite composite sintered body preferably contains Si in a range of 41 to 79 mole percent in $Si_3N_4$ equivalent, Me in a range of 13 to 46 mole percent in oxide equivalent, and the group 2 element in a range of 5 to 20 mole percent in oxide equivalent. The content of the group 2 element of not lower than 5 mole percent allows for sintering at ordinary pressure. The content of the group 2 element of higher than 20 mole percent tends to lower the mechanical strength and the Young's modulus. In the case of (B) using at least one element selected among La, Ce, and Pr as the additive, the resulting silicon nitride-melilite composite sintered body preferably contains Si in a range of 45 to 83 mole percent in $Si_3N_4$ equivalent, Me in a range of 15 to 49 mole percent in oxide equivalent, and the at least one element selected among La, Ce, and Pr in a range of 0.3 to 12 mole percent in oxide equivalent. The content of the selected element of not lower than 0.3 mole percent allows firing at ordinary pressure. The content of the selected element of higher than 12 mole percent tends to lower the mechanical strength or the Young's modulus or increase the thermal expansion coefficient to or over 6 ppm/K.

In the case of (A), in order to further enhance and stabilize the sintering performance, the additive is preferably at least one element selected among Mg, Ca, and Sr. Especially preferable is Sr.

Another selected element but those mentioned above may further be added as another additive to the silicon nitride-melilite composite sintered body of the invention. This additive may be at least one element selected among Al (aluminum), Si (silicon), group 4 elements, group 5 elements, and group 6 elements. Addition of any of these elements ensures the more stable sintering performance. Addition of a transition metal, such as W (tungsten) or Mo (molybdenum), blackens the resulting composite sintered body and thus effectively reduces the potential for uneven color of the resulting composite sintered body. In order to achieve the above effect, for example, the content of Al is preferably in a range of 0.5 to 10 mole percent in oxide equivalent. The content of Al of higher than 10 mole percent in oxide equivalent, however, increases the ratio of the other phases but the silicon nitride crystalline phases and the melilite crystalline phases and thereby undesirably lowers the Young's modulus.

Figure 1B:
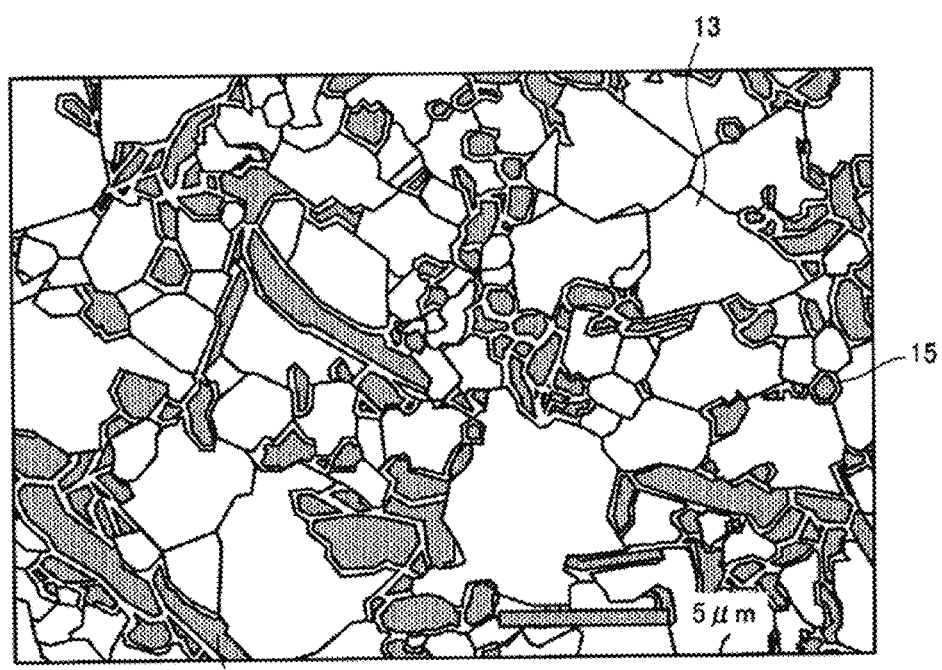
FIG. 1B is a schematic reproduction view of the electron micrograph shown in FIG. 1A.

FIG. 1A is an electron micrograph at a 5000-fold magnification by SEM imaging of a mirror-like finished and etched cutting plane of a silicon nitride-melilite composite sintered body in accordance with the invention (a composite sintered body of Working Example 31 discussed later). FIG. 1B is a schematic reproduction view of the electron micrograph of FIG. 1A.

As shown in FIGS. 1A and 1B, the typical silicon nitride-melilite composite sintered body in accordance with the invention includes silicon nitride crystalline phases 11, melilite crystalline phases 13, and grain boundary phases 15. The grain boundary phases 15 are present in the form of glass phases and/or other crystalline phases but the silicon nitride crystalline phases and the melilite crystalline phases.

In the present embodiment of the invention, the preferable area ratios on a cutting plane of the silicon nitride-melilite composite sintered body are 2 to 70 area percent of the silicon nitride crystalline phases, 20 to 97 area percent of the melilite crystalline phases, and 1 to 20 area percent of the glass phases and the other crystalline phases but the silicon nitride crystalline phases and the melilite crystalline phases. The preferable area ratio of the glass phases and the other crystalline phases but the silicon nitride crystalline phases and the melilite crystalline phases in the range of 1 to 20 area percent means that the total area ratio of the silicon nitride crystalline phases 11 and the melilite crystalline phases 13 is preferably not less than 80% on the cutting plane of the composite sintered body. Setting the area ratio of the silicon nitride crystalline phases to a range of 9 to 60 area percent and the area ratio of the melilite crystalline phases to a range of 25 to 90 area percent enables the thermal expansion coefficient of the resulting silicon nitride-melilite composite sintered body to be regulated to a range of 3 to 5 ppm/K. Such regulation is especially desirable for the favorable matching of the thermal expansion coefficient of the composite sintered body with that of a semiconductor wafer.

Setting the area ratio of the silicon nitride crystalline phases, the area ratio of the melilite crystalline phases, and the area ratio of the glass phases and the other crystalline phases but the silicon nitride crystalline phases and the melilite crystalline phases to the above respective ranges enables the resulting silicon nitride-melilite composite sintered body to have any arbitrary average thermal expansion coefficient in the range of 2 to 6 ppm/K or more preferably in the range of 3 to 5 ppm/K at the temperatures of 23 to 150° C. and the sufficiently high Young's modulus of not lower than 200 GPa.

The ratio (area ratio) of the melilite crystalline phases on the cutting plane of the silicon nitride-melilite composite sintered body is determinable by any of the techniques, electron probe microanalysis (EPMA), transmission electron microscopy (TEM), scanning electron microscopy (SEM), X-ray diffractometry (XRD), and energy dispersive X-ray spectroscopy (EDS). The structure of the crystalline phases included in the composite sintered body, the element ratios of individual particles, and TEM diffraction patterns of individual particles (when required) are obtained from such measurements. These obtained pieces of information are used to identify the crystalline particles mainly made of Me, Si, O, and N as melilite particles and determine the ratio of the melilite crystalline phases. The identification is made sequentially from crystalline particles of the greater particle diameter in any preset visual field. Similarly, the crystalline particles mainly made of Si and N are identified as silicon nitride particles.

The presence of the silicon nitride and the melilite in the silicon nitride-melilite composite sintered body of the present embodiment is observable by powder X-ray diffractometry of the composite sintered body. In the X-ray diffraction pattern of the silicon nitride-melilite composite sintered body of the invention, it is preferable that a main peak diffraction intensity 'a' of the silicon nitride (diffraction intensity of a highest peak among all the peaks of the silicon nitride) and a main peak diffraction intensity 'b' of the melilite (diffraction intensity of a highest peak among all the peaks of the melilite) satisfy a relation of:

$$50 \leq [b/(a+b)] \times 100 \leq 98.$$

The silicon nitride-melilite composite sintered body satisfying the above relation has any arbitrary average thermal expansion coefficient in the range of 2 to 6 ppm/K at the temperatures of 23 to 150° C.

The silicon nitride-melilite composite sintered body of the invention may be manufactured according to a procedure discussed below.

The procedure (i) prepares a powdery mixture by mixing silicon nitride powder, an oxide or a salt of an organic acid containing a metal element Me that combines silicon nitride to generate a melilite (for example, yttria $Y_2O_3$, yttrium formate, or yttrium carbonate), and an additive (if any) containing at least one element selected among group 2 elements, La, Ce, and Pr with a dispersant and a dispersion medium, such as ethanol, in a ball mill, (ii) dries the prepared powdery mixture, and (iii) granulates the dried powdery mixture to particles. The particles are then pressed or otherwise molded or formed into a compact in a desired shape. The compact is fired in a nitrogen atmosphere of 0.1 to 1.0 MPa in a firing furnace at temperatures of 1700 to 1800° C. for 2 through 8 hours. The firing method is not specifically restricted, but any suitable technique may be adopted as the firing method. Any combination of multiple different techniques may also be adopted as the firing method.

The resulting silicon nitride-melilite composite sintered body of the invention thus obtained has the excellent mechanical strength and the average thermal expansion coefficient that is arbitrarily adjustable in the range of 2 to 6 ppm/K at the temperatures of 23 to 150° C. The silicon nitride-melilite composite sintered body of the invention is thus effectively applied as the substrate material or the structural material of a device used for inspection of semiconductor wafers, such as a probe card. The silicon nitride-melilite composite sintered body of the invention is also effectively applied as the substrate material or the structural material of a device used for production of semiconductor.

Figure 2:
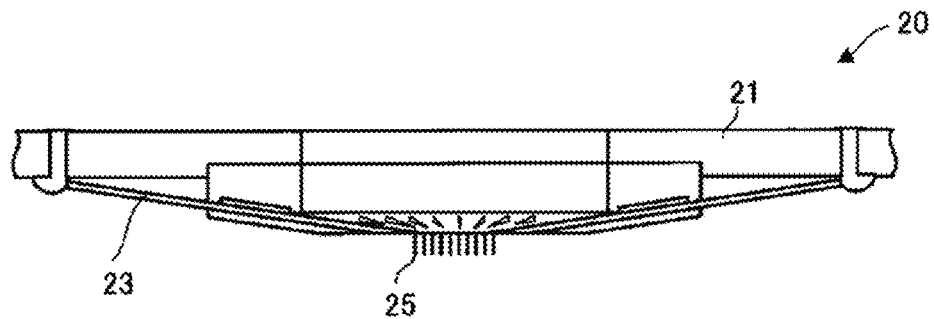
FIG. 2 is a sectional view schematically showing one example of a probe card utilizing the silicon nitride-melilite composite sintered body in accordance with the invention.
Figure 3:
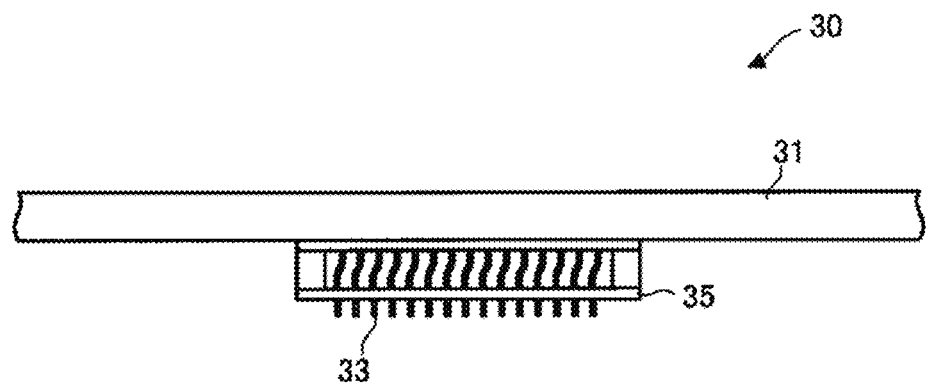
FIG. 3 is a sectional view schematically showing another example of the probe card utilizing the silicon nitride-melilite composite sintered body in accordance with the invention.
Figure 4:
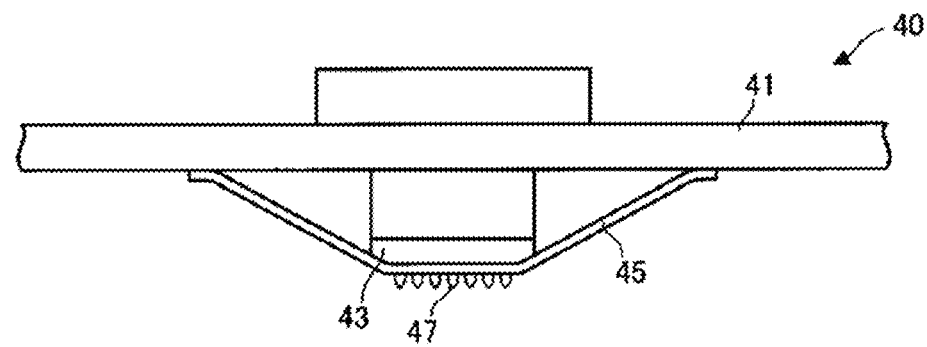
FIG. 4 is a sectional view schematically showing still another example of the probe card utilizing the silicon nitride-melilite composite sintered body in accordance with the invention.
Figure 5A:
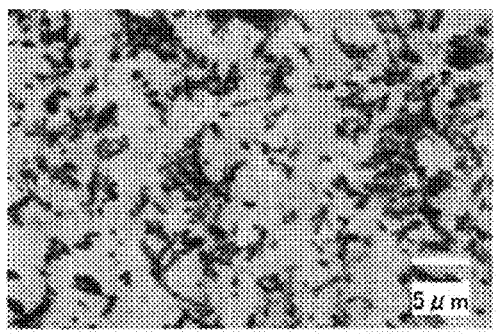
FIGS. 5A through 5D are electron micrographs by SEM imaging of other examples of the silicon nitride-melilite composite sintered body in accordance with the invention.
Figure 5B:
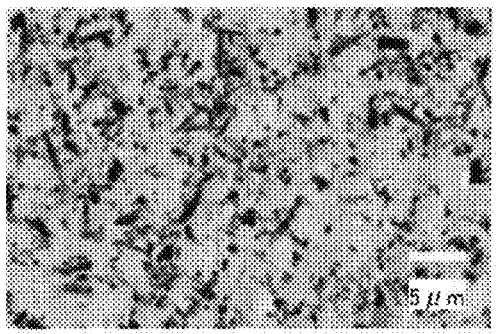
Figure 5C:
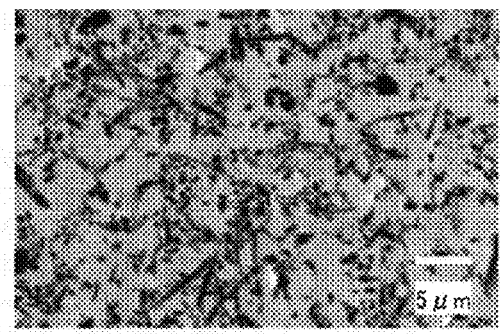
Figure 5D:
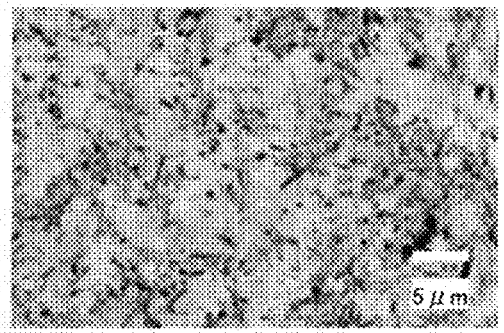

FIGS. 2 through 4 are sectional views schematically showing probe cards utilizing the silicon nitride-melilite composite sintered body of the invention. A probe card 20 shown in FIG. 2 has a large number of cantilevers 23 mounted on a lower face of a ceramic substrate 21. Probes 25 formed on respective free ends of the multiple cantilevers 23 are brought into contact with terminal pads (not shown) of a semiconductor wafer (not shown). A probe card 30 shown in FIG. 3 has a large number of probes 33 provided on a lower face of a ceramic substrate 31. The probes 33 utilize the buckling stress to come into contact with terminal pads (not shown) of a semiconductor wafer (not shown). The probe 30 of FIG. 3 also has a buckling restriction member 35 to restrict buckling of the probes 33. A probe card 40 shown in FIG. 4 has a cushion member 43 and a membrane 45 mounted on a lower face of a ceramic substrate 41. The ceramic substrate 41 is pressed against a semiconductor wafer (not shown), so that a large number of terminals 47 provided on a lower face of the membrane 45 are brought into contact with terminal pads (not shown) of a semiconductor wafer (not shown).

In the probe cards 20, 30, and 40, at least the ceramic substrates 21, 31, and 41 are mainly made of the silicon nitride-melilite composite sintered body of the invention. The silicon nitride-melilite composite sintered body of the invention may also be used for some components other than the ceramic substrates 21, 31, and 41. For example, in the probe card 30 of FIG. 3, the buckling restriction member 35 may be mainly made of the silicon nitride-melilite composite sintered body of the invention.

Each of the probe cards 20, 30, and 40 utilizes the material having the adequate thermal expansion coefficient. In the case of inspection of the operating conditions of a semiconductor wafer both in a condition from room temperature to high temperatures and in a condition from room temperature to low temperatures, each of the probe cards 20, 30, and 40 assures inspection with the high reliability without causing poor contact of the terminal pads of the semiconductor wafer with the probes or terminals 25, 33, or 47 of the probe card 20, 30, or 40.

EXAMPLES

The present invention is described below in detail in relation to some working examples, although these working examples are to be considered in all aspects as illustrative and not restrictive in any sense.

Working Examples 1 to 67 and Comparative Examples 1 and 2

Silicon nitride ($Si_3N_4$) powder having an average particle diameter of 0.7 μm, yttria ($Y_2O_3$) powder having an average particle diameter of 1.2 μm, and some of $SrCO_3$ powder, $La_2O_3$ powder, $CeO_2$ powder, and $Al_2O_3$ powder as an additive were used as the materials to prepare diversity of powdery mixtures having the compositions shown in Tables 1 through 5. Each of the resulting powdery mixtures was mixed with ethanol in a ball mill, was heated and dried, and was granulated to particles.

With regard to Working Examples 7 to 20, 24 to 38, and 41 to 67, the particles were pressed into a rectangular parallelepiped compact of 70 mm×70 mm×20 mm. The prismatic compact was subjected to cold isostatic pressing (CIP) under a pressure of 98 MPa and was fired in a nitrogen atmosphere of 0.1 MPa in a firing furnace at temperatures of 1700 to 1800° C. for 4 hours.

With regard to Working Examples 1 to 6 and 21 and Comparative Examples 1 and 2, the particles were pressed into a prismatic compact of 70 mm×70 mm×20 mm. The prismatic compact was placed in a carbon mold and was subjected to hot pressing to be densified under a pressure of 30 MPa at a temperature of 1750° C. for 2 hours.

With regard to Working Examples 22 and 39, the particles were pressed into a prismatic compact of 70 mm×70 mm×20 mm. The prismatic compact was subjected to cold isostatic pressing (CIP) under a pressure of 98 MPa, was fired in a nitrogen atmosphere of 0.1 MPa in a firing furnace at a temperature of 1750° C. for 4 hours, and was further subjected to gas pressure firing to be densified under a pressure of 8.0 MPa at a temperature of 1700° C. for 2 hours.

With regard to Working Examples 23 and 40, the particles were pressed into a prismatic compact of 70 mm×70 mm×20 mm. The prismatic compact was subjected to cold isostatic pressing (CIP) under a pressure of 98 MPa, was fired in a nitrogen atmosphere of 0.1 MPa in a firing furnace at a temperature of 1750° C. for 4 hours, and was further subjected to hot isostatic pressing (HIP) under a pressure of 100 MPa at a temperature of 1700° C. for 2 hours.

The composite sintered bodys of the respective working examples and comparative examples were evaluated by measurement of various properties and characteristics according to the procedures discussed below.

[Theoretical Density Ratio] The procedure measured the dimensions and the weight of each composite sintered body and calculated a ratio of the composite sintered body to a theoretical density. The theoretical density was computed on the assumption that the yttria ($Y_2O_3$) powder was fully converted into the melilite ($Me_2Si_3O_3N_4$), that the residual silicon nitride powder remained, and that the other additives were present in the form of oxides.

[Water Absorption Rate] The procedure defoamed each composite sintered body in water to make the composite sintered body absorb water and dried the water-absorbed composite sintered body. The water absorption rate of the composite sintered body was then calculated according to an equation given below:

Water Absorption Rate (%)=[($W_1-W_2$)/$W_2$]×100 where $W_1$ denotes the weight of the water-absorbed composite sintered body and $W_2$ denotes the weight of the dried composite sintered body.

[Melilite Main Peak Intensity Ratio] The procedure crushed and ground each composite sintered body into powder and made the powder subjected to powder X-ray diffractometry with an X-ray diffractometer RU-200T (manufactured by Rigaku Corporation) to measure a main peak diffraction intensity 'b' of the melilite ($Me_2Si_3O_3N_4$) and a main peak diffraction intensity 'a' of $Si_3N_4$. The melilite main peak intensity ratio was then calculated according to an equation given below:

Melilite Main Peak Intensity Ratio (%)=[$b/(a+b)$]×100

[Average Thermal Expansion Coefficient] The procedure measured the average thermal expansion coefficient of each composite sintered body at the temperatures of 23 to 150° C. by the compression loading method with a thermal expansion coefficient measuring instrument, thermo-mechanical analyzer TMA8310 (manufactured by Rigaku Corporation).

[Bending Strength] The procedure measured the bending strength of each composite sintered body at room temperature (23° C.) in conformity with Japanese Industrial Standards JIS R 1601.

[Young's Modulus] The procedure measured the Young's modulus of each composite sintered body at room temperature (23° C.) by the ultrasonic pulse method in conformity with JIS R 1602.

[Area Ratio] The procedure processed a surface area of 4 mm×10 mm in each composite sintered body cut into dimensions of 3 mm×4 mm×10 mm by mirror-like finishing and observed the mirror-like finished surface by scanning electron microscopy with an SEM (scanning electron microscope) JSM-6460LA (manufactured by JEOL Ltd). The procedure also observed a secondary electron image and a reflected electron image of the composite sintered body by electron probe microanalysis with an EPMA (electron probe microanalyzer) JXA-8500F (manufactured by JEOL Ltd.) and conducted beam scan mapping with a WDS (wavelength dispersive X-ray spectrometer), in order to determine the respective area ratios of the silicon nitride crystalline phases, the melilite crystalline phases, and the other phases on the surface. The other phases include glass phases and other crystalline phases but the silicon nitride crystalline phases and the melilite crystalline phases and are shown as 'other phase' in Tables 1 through 5. When the composite sintered body has a relatively high ratio of the glass phases and the other crystalline phases but the silicon nitride crystalline phases and the melilite crystalline phases, it may be difficult to determine the respective area ratios only by the above instrumental observations. In such cases and otherwise as needed, the procedure further conducted scanning transmission electron microscopy with an STEM (scanning transmission electron microscope) HD-2000 (manufactured by Hitachi High-Technologies Corporation) and energy dispersive X-ray analysis with an EDS (energy dispersive X-ray analyzer) Genesis (manufactured by EDAX Division, AMETEK Inc.). In some cases, the procedure additionally etched the mirror-like finished surface of the composite sintered body and observed the etched surface with the SEM and the other instruments to determine the respective area ratios.

The results of such measurements and evaluations are also shown in Tables 1 through 5. With regard to Working Examples 60 to 67, the amount of surplus oxygen is additionally shown in Table 5.

TABLE 1

| | | COMPOSITION(mol %) | | | | | FIRING | THEORETICAL | WATER | MELILITE MAIN PEAK |
|---|---|---|---|---|---|---|---|---|---|---|
| | | | SINTERING ADDITIVES | | | | TEMPERATURE | DENSITY | ABSORPTION | INTENSITY |
| | | $Si_3N_4$ | $Y_2O_3$ | SrO | $La_2O_3$ | $CeO_2$ | $Al_2O_3$ | (° C.) | RATIO (%) | RATE (%) | RATIO (%) |
| WORKING EXAMPLES | 1 | 83.0 | 17.0 | — | — | — | — | 1750 | 99.2 | 0.03 | 60 |
| | 2 | 80.0 | 20.0 | — | — | — | — | 1750 | 99.1 | 0.02 | 76 |
| | 3 | 70.0 | 30.0 | — | — | — | — | 1750 | 99.5 | 0.03 | 85 |
| | 4 | 65.0 | 35.0 | — | — | — | — | 1750 | 99.3 | 0.03 | 88 |
| | 5 | 60.0 | 40.0 | — | — | — | — | 1750 | 99.2 | 0.02 | 92 |
| | 6 | 55.0 | 45.0 | — | — | — | — | 1750 | 99.5 | 0.03 | 95 |
| | 7 | 50.0 | 45.0 | 5.0 | — | — | — | 1750 | 98.7 | 0.05 | 97 |
| | 8 | 49.0 | 46.0 | 5.0 | — | — | — | 1750 | 98.6 | 0.10 | 96 |
| | 9 | 58.0 | 37.0 | 5.0 | — | — | — | 1750 | 98.0 | 0.12 | 92 |
| | 10 | 79.0 | 13.0 | 8.0 | — | — | — | 1750 | 99.0 | 0.05 | 58 |
| | 11 | 75.0 | 15.0 | 10.0 | — | — | — | 1750 | 99.0 | 0.11 | 63 |
| | 12 | 70.0 | 20.0 | 10.0 | — | — | — | 1750 | 98.5 | 0.08 | 72 |
| | 13 | 65.0 | 25.0 | 10.0 | — | — | — | 1750 | 99.0 | 0.07 | 81 |

| | | AVERAGE THERMAL EXPANSION COEFFICIENT (ppm/K) | BENDING STRENGTH (MPa) | YOUNG'S MODULUS (GPa) | AREA RATIOS(%) | | |
|---|---|---|---|---|---|---|---|
| | | | | | $Si_3N_4$ CRYSTALLINE PHASE | MELILITE CRYSTALLINE PHASE | OTHER PHASE |
| WORKING EXAMPLES | 1 | 2.5 | 650 | 287 | 65 | 34 | 1 |
| | 2 | 2.9 | 630 | 283 | 60 | 39 | 1 |
| | 3 | 3.5 | 570 | 265 | 40 | 59 | 1 |
| | 4 | 4.0 | 530 | 260 | 30 | 69 | 1 |
| | 5 | 4.3 | 510 | 253 | 20 | 79 | 1 |
| | 6 | 4.6 | 460 | 245 | 10 | 89 | 1 |
| | 7 | 5.3 | 480 | 235 | 5 | 92 | 3 |

TABLE 1-continued

| | | | | | | |
|---|---|---|---|---|---|---|
| 8 | 5.3 | 480 | 230 | 3 | 94 | 3 |
| 9 | 4.3 | 600 | 245 | 22 | 75 | 3 |
| 10 | 2.6 | 700 | 285 | 69 | 27 | 4 |
| 11 | 2.9 | 700 | 275 | 64 | 31 | 5 |
| 12 | 3.6 | 650 | 270 | 53 | 42 | 5 |
| 13 | 4.0 | 600 | 260 | 43 | 52 | 5 |

TABLE 2

| | | COMPOSITION(mol %) | | | | | FIRING | THEORETICAL | WATER | MELILITE MAIN PEAK |
|---|---|---|---|---|---|---|---|---|---|---|
| | | | SINTERING ADDITIVES | | | | TEMPERATURE | DENSITY | ABSORPTION | INTENSITY |
| | | $Si_3N_4$ | $Y_2O_3$ | SrO | $La_2O_3$ | $CeO_2$ | $Al_2O_3$ | (°C.) | RATIO (%) | RATE (%) | RATIO (%) |
| WORKING EXAMPLES | 14 | 60.0 | 30.0 | 10.0 | — | — | — | 1750 | 98.5 | 0.05 | 86 |
| | 15 | 55.0 | 35.0 | 10.0 | — | — | — | 1750 | 99.0 | 0.05 | 92 |
| | 16 | 50.0 | 40.0 | 10.0 | — | — | — | 1750 | 99.0 | 0.04 | 95 |
| | 17 | 52.0 | 33.0 | 15.0 | — | — | — | 1750 | 99.0 | 0.06 | 92 |
| | 18 | 41.0 | 39.0 | 20.0 | — | — | — | 1750 | 99.5 | 0.03 | 98 |
| | 19 | 62.0 | 18.0 | 20.0 | — | — | — | 1750 | 99.5 | 0.03 | 75 |
| | 20 | 52.0 | 46.0 | 2.0 | — | — | — | 1750 | 92.0 | 1.80 | 97 |
| | 21 | 52.0 | 46.0 | 2.0 | — | — | — | 1750 | 99.2 | 0.01 | 97 |
| | 22 | 50.0 | 47.0 | 3.0 | — | — | — | 1750 | 99.0 | 0.05 | 97 |
| | 23 | 52.0 | 46.0 | 2.0 | — | — | — | 1750 | 99.5 | 0.05 | 96 |
| | 24 | 46.0 | 29.0 | 25.0 | — | — | — | 1750 | 99.1 | 0.03 | 92 |
| | 25 | 43.0 | 27.0 | 30.0 | — | — | — | 1750 | 98.5 | 0.03 | 92 |

| | | AVERAGE THERMAL EXPANSION COEFFICIENT (ppm/K) | BENDING STRENGTH (MPa) | YOUNG'S MODULUS (GPa) | AREA RATIOS(%) | | |
|---|---|---|---|---|---|---|---|
| | | | | | $Si_3N_4$ CRYSTALLINE PHASE | MELILITE CRYSTALLINE PHASE | OTHER PHASE |
| WORKING EXAMPLES | 14 | 4.3 | 610 | 250 | 32 | 63 | 5 |
| | 15 | 4.5 | 550 | 240 | 21 | 73 | 6 |
| | 16 | 5.0 | 500 | 235 | 11 | 84 | 5 |
| | 17 | 4.7 | 500 | 235 | 21 | 71 | 8 |
| | 18 | 6.0 | 450 | 210 | 2 | 87 | 11 |
| | 19 | 4.5 | 550 | 250 | 49 | 40 | 11 |
| | 20 | 5.3 | 150 | 181 | 5 | 92 | 3 |
| | 21 | 5.3 | 510 | 240 | 5 | 92 | 3 |
| | 22 | 5.4 | 450 | 235 | 3 | 95 | 2 |
| | 23 | 5.1 | 470 | 238 | 6 | 92 | 2 |
| | 24 | 5.3 | 300 | 200 | 20 | 66 | 14 |
| | 25 | 5.7 | 250 | 180 | 18 | 61 | 21 |

45

TABLE 3

| | | COMPOSITION(mol %) | | | | | | FIRING | THEORETICAL | WATER | MELILITE MAIN PEAK |
|---|---|---|---|---|---|---|---|---|---|---|---|
| | | | | SINTERING ADDITIVES | | | | TEMPERATURE | DENSITY | ABSORPTION | INTENSITY |
| | | $Si_3N_4$ | $Y_2O_3$ | SrO | $La_2O_3$ | $CeO_2$ | $Al_2O_3$ | (°C.) | RATIO (%) | RATE (%) | RATIO (%) |
| WORKING EXAMPLES | 26 | 51.0 | 48.7 | — | 0.3 | — | — | 1750 | 98.0 | 0.18 | 98 |
| | 27 | 50.5 | 49.0 | — | 0.5 | — | — | 1750 | 99.2 | 0.03 | 98 |
| | 28 | 55.0 | 44.0 | — | 1.0 | — | — | 1750 | 99.0 | 0.06 | 95 |
| | 29 | 83.0 | 15.0 | — | 2.0 | — | — | 1750 | 98.8 | 0.11 | 62 |
| | 30 | 76.0 | 22.0 | — | 2.0 | — | — | 1750 | 98.5 | 0.08 | 71 |
| | 31 | 71.0 | 27.0 | — | 2.0 | — | — | 1750 | 99.0 | 0.05 | 82 |
| | 32 | 65.0 | 33.0 | — | 2.0 | — | — | 1750 | 98.5 | 0.15 | 85 |
| | 33 | 60.0 | 38.0 | — | 2.0 | — | — | 1750 | 99.0 | 0.08 | 93 |
| | 34 | 60.0 | 37.6 | — | 2.4 | — | — | 1750 | 98.1 | 0.18 | 90 |
| | 35 | 81.0 | 16.0 | — | 3.0 | — | — | 1750 | 99.0 | 0.05 | 62 |
| | 36 | 45.0 | 45.0 | — | 10.0 | — | — | 1750 | 99.0 | 0.06 | 98 |

TABLE 3-continued

| | Si₃N₄ | Y₂O₃ | SrO | La₂O₃ | CeO₂ | Al₂O₃ | Firing Temp | Theoretical Density Ratio (%) | Water Absorption Rate (%) | Melilite Main Peak Intensity Ratio (%) |
|---|---|---|---|---|---|---|---|---|---|---|
| 37 | 54.0 | 34.0 | — | 12.0 | — | — | 1750 | 98.6 | 0.11 | 92 |
| 38 | 55.0 | 44.9 | — | 0.1 | — | — | 1750 | 92.0 | 2.30 | 95 |
| 39 | 55.0 | 44.9 | — | 0.1 | — | — | 1750 | 99.5 | 0.03 | 94 |
| 40 | 60.0 | 39.9 | — | 0.1 | — | — | 1750 | 99.1 | 0.06 | 90 |
| 41 | 45.0 | 40.0 | — | 15.0 | — | — | 1750 | 98.5 | 0.05 | 96 |
| 42 | 43.0 | 39.0 | — | — | 18.0 | — | 1750 | 98.2 | 0.11 | 97 |
| 43 | 43.0 | 37.0 | — | — | 20.0 | — | 1750 | 98.0 | 0.11 | 94 |
| 44 | 51.0 | 22.0 | 15.5 | — | 11.0 | 0.5 | 1700 | 98.5 | 0.05 | 85 |
| 45 | 50.0 | 22.0 | 11.0 | — | 11.0 | 6.0 | 1700 | 98.7 | 0.05 | 85 |
| 46 | 50.0 | 20.0 | 10.0 | — | 10.0 | 10.0 | 1700 | 99.1 | 0.03 | 82 |

| | | Average Thermal Expansion Coefficient (ppm/K) | Bending Strength (MPa) | Young's Modulus (GPa) | Si₃N₄ Crystalline Phase | Melilite Crystalline Phase | Other Phase |
|---|---|---|---|---|---|---|---|
| WORKING EXAMPLES | 26 | 5.3 | 450 | 235 | 2 | 97 | 1 |
| | 27 | 5.3 | 450 | 235 | 2 | 97 | 1 |
| | 28 | 4.7 | 500 | 240 | 11 | 87 | 2 |
| | 29 | 2.6 | 700 | 290 | 68 | 30 | 2 |
| | 30 | 3.3 | 650 | 275 | 54 | 43 | 3 |
| | 31 | 3.7 | 600 | 265 | 44 | 53 | 3 |
| | 32 | 4.0 | 600 | 255 | 32 | 65 | 3 |
| | 33 | 4.2 | 580 | 250 | 22 | 75 | 3 |
| | 34 | 4.5 | 550 | 250 | 22 | 74 | 4 |
| | 35 | 2.7 | 700 | 280 | 65 | 31 | 4 |
| | 36 | 5.8 | 450 | 215 | 2 | 86 | 12 |
| | 37 | 4.9 | 550 | 230 | 20 | 66 | 14 |
| | 38 | 4.7 | 120 | 183 | 10 | 88 | 2 |
| | 39 | 4.7 | 480 | 240 | 10 | 89 | 1 |
| | 40 | 4.3 | 500 | 250 | 20 | 79 | 1 |
| | 41 | 6.2 | 200 | 206 | 5 | 78 | 17 |
| | 42 | 7.0 | 230 | 201 | 4 | 77 | 19 |
| | 43 | 7.1 | 200 | 190 | 6 | 72 | 22 |
| | 44 | 4.5 | 550 | 225 | 34 | 51 | 15 |
| | 45 | 4.8 | 500 | 230 | 33 | 50 | 17 |
| | 46 | 4.7 | 500 | 240 | 35 | 46 | 19 |

TABLE 4

| | | Composition (mol %) | | | | | | Firing Temperature (°C) | Theoretical Density Ratio (%) | Water Absorption Rate (%) | Melilite Main Peak Intensity Ratio (%) |
|---|---|---|---|---|---|---|---|---|---|---|---|
| | | Si₃N₄ | Y₂O₃ | SrO | La₂O₃ | CeO₂ | Al₂O₃ | | | | |
| WORKING EXAMPLES | 47 | 54.0 | 34.0 | 9.0 | 3.0 | — | — | 1725 | 99.0 | 0.02 | 91 |
| | 48 | 57.0 | 37.0 | — | 2.0 | — | 4.0 | 1725 | 98.4 | 0.06 | 92 |
| | 49 | 57.0 | 37.0 | — | — | 3.0 | 3.0 | 1725 | 98.2 | 0.14 | 93 |
| | 50 | 57.0 | 30.0 | 10.0 | — | — | 3.0 | 1725 | 98.9 | 0.25 | 87 |
| | 51 | 54.0 | 29.0 | 14.0 | — | — | 3.0 | 1725 | 99.2 | 0.05 | 87 |
| | 52 | 53.0 | 35.0 | 9.0 | — | — | 3.0 | 1725 | 99.9 | 0.03 | 91 |
| | 53 | 73.0 | 15.0 | 9.0 | — | — | 3.0 | 1725 | 98.5 | 0.08 | 67 |
| | 54 | 60.0 | 28.0 | 9.0 | — | — | 3.0 | 1725 | 98.7 | 0.06 | 86 |
| | 55 | 45.0 | 43.0 | 9.0 | — | — | 3.0 | 1725 | 99.1 | 0.04 | 97 |
| | 56 | 43.0 | 40.0 | 9.0 | — | — | 8.0 | 1725 | 99.2 | 0.05 | 96 |

| | | Average Thermal Expansion Coefficient (ppm/K) | Bending Strength (MPa) | Young's Modulus (GPa) | Si₃N₄ Crystalline Phase | Melilite Crystalline Phase | Other Phase |
|---|---|---|---|---|---|---|---|
| WORKING EXAMPLES | 47 | 4.8 | 550 | 240 | 21 | 71 | 8 |
| | 48 | 4.5 | 530 | 250 | 20 | 75 | 5 |
| | 49 | 4.6 | 550 | 250 | 21 | 76 | 3 |
| | 50 | 4.5 | 530 | 245 | 29 | 64 | 7 |
| | 51 | 4.6 | 500 | 240 | 27 | 63 | 10 |
| | 52 | 4.7 | 520 | 240 | 19 | 74 | 7 |
| | 53 | 3.1 | 650 | 277 | 62 | 31 | 7 |
| | 54 | 4.1 | 570 | 250 | 34 | 59 | 7 |
| | 55 | 5.6 | 450 | 230 | 2 | 91 | 7 |
| | 56 | 5.5 | 470 | 225 | 3 | 87 | 10 |

TABLE 5

| | | COMPOSITION(mol %) | | | | | | AMOUNT OF SURPLUS OXYGEN | FIRING TEMPERATURE | THEORETICAL DENSITY | WATER ABSORPTION |
|---|---|---|---|---|---|---|---|---|---|---|---|
| | | | SINTERING ADDITIVES | | | | | (mol %) | | | |
| | | $Si_3N_4$ | $Y_2O_3$ | SrO | $La_2O_3$ | $CeO_2$ | $Al_2O_3$ | $SiO_2$ | (° C.) | RATIO (%) | RATE (%) |
| WORKING EXAMPLES | 57 | 51.0 | 22.0 | 13.0 | — | 11.0 | 3.0 | — | 1700 | 98.4 | 0.03 |
| | 58 | 54.0 | 23.0 | 14.0 | — | 6.0 | 3.0 | — | 1700 | 98.9 | 0.03 |
| | 59 | 41.0 | 35.0 | 9.0 | — | — | 15.0 | — | 1725 | 98.5 | 0.10 |
| | 60 | 54.5 | 29.7 | 9.4 | — | — | 3.4 | 3.0 | 1750 | 98.5 | 0.10 |
| | 61 | 54.0 | 29.5 | 9.0 | — | — | 3.5 | 4.0 | 1750 | 99.5 | 0.03 |
| | 62 | 52.5 | 28.5 | 9.0 | — | — | 3.5 | 6.5 | 1700 | 99.6 | 0.02 |
| | 63 | 51.0 | 28.0 | 9.0 | — | — | 3.0 | 9.0 | 1700 | 99.5 | 0.03 |
| | 64 | 49.0 | 27.0 | 8.5 | — | — | 3.0 | 12.5 | 1700 | 99.5 | 0.03 |
| | 65 | 47.0 | 26.0 | 8.0 | — | — | 3.0 | 16.0 | 1700 | 99.3 | 0.05 |
| | 66 | 45.5 | 24.5 | 8.0 | — | — | 3.0 | 19.0 | 1700 | 99.0 | 0.08 |
| | 67 | 44.0 | 24.0 | 7.5 | — | — | 2.5 | 22.0 | 1700 | 99.0 | 0.11 |
| COMPARATIVE EXAMPLES | 1 | 90.0 | 10.0 | — | — | — | — | — | 1750 | 99.1 | 0.05 |
| | 2 | 40.0 | 60.0 | — | — | — | — | — | 1750 | 99.0 | 0.03 |

| | | MELITE MAIN PEAK INTENSITY RATIO (%) | AVERAGE THERMAL EXPANSION COEFFICIENT (ppm/K) | BENDING STRENGTH (MPa) | YOUNG'S MODULUS (GPa) | AREA RATIOS(%) | | |
|---|---|---|---|---|---|---|---|---|
| | | | | | | $Si_3N_4$ CRYSTALLINE PHASE | MELILITE CRYSTALLINE PHASE | OTHER PHASE |
| WORKING EXAMPLES | 57 | 91 | 4.5 | 500 | 225 | 34 | 50 | 16 |
| | 58 | 90 | 4.5 | 500 | 240 | 35 | 51 | 14 |
| | 59 | 94 | 5.8 | 350 | 185 | 2 | 76 | 22 |
| | 60 | 88 | 4.4 | 700 | 237 | 27 | 64 | 9 |
| | 61 | 88 | 4.5 | 700 | 237 | 27 | 63 | 10 |
| | 62 | 89 | 4.5 | 680 | 234 | 27 | 62 | 11 |
| | 63 | 88 | 4.6 | 620 | 232 | 26 | 62 | 12 |
| | 64 | 89 | 4.6 | 550 | 229 | 25 | 61 | 14 |
| | 65 | 88 | 4.6 | 500 | 226 | 24 | 59 | 17 |
| | 66 | 89 | 4.7 | 400 | 220 | 25 | 57 | 18 |
| | 67 | 89 | 4.7 | 260 | 215 | 24 | 57 | 19 |
| COMPARATIVE EXAMPLES | 1 | 57 | 1.7 | 660 | 300 | 80 | 19 | 1 |
| | 2 | 100 | 6.2 | 350 | 190 | 0 | 78 | 22 |

As clearly shown in Tables 1 through 5, the silicon nitride-melilite composite sintered bodys of Working Examples 1 to 67 had (i) the silicon nitride crystalline phases, (ii) the melilite crystalline phases of $Me_2Si_3O_3N_4$ where Me denotes a metal element combining with silicon nitride to generate the melilite, and (iii) the grain boundary phases. The ratio of the melilite crystalline phases was not less than 20% on the cutting plane of the composite sintered body. The resulting composite sintered bodys of these Working Examples all had the arbitrarily adjustable average thermal expansion coefficient at the temperatures of 23 to 150° C., the favorable bending strength, and the favorable Young's modulus. The composite sintered body of Comparative Example 1, on the other hand, had a low ratio of the melilite crystalline phases and thereby an undesirably low thermal expansion coefficient. The composite sintered body of Comparative Example 2 had no silicon nitride crystalline phase and thereby an undesirably low Young's modulus.

In the silicon nitride-melilite composite sintered bodys of Working Examples 1 to 19, 21 to 24, 26 to 37, 39 to 42, 44 to 58, and 60 to 67, the water absorption rate was not higher than 1.5%, and the sum of the ratio of the melilite crystalline phases and the ratio of the silicon nitride crystalline phases was not less than 80% on the cutting plane of the composite sintered body. The resulting composite sintered bodys of these Working Examples all had the sufficiently high Young's modulus of not lower than 200 GPa.

The silicon nitride-melilite composite sintered bodys of Working Examples 1 to 6 had Si in range of 41 to 83 mole percent in $Si_3N_4$ equivalent and Y in a range of 13 to 50 mole percent in oxide equivalent but included no additives. The composite sintered bodys of these Working Examples were prepared by hot pressing and had the adequate average thermal expansion coefficient in the range of 2 to 6 ppm/K at the temperatures of 23 to 150° C., the favorable bending strength, and the favorable Young's modulus. The composite sintered body of Comparative Example 1 had the content of silicon nitride of not lower than 90 mole percent and accordingly had an undesirably low ratio of the melilite crystalline phases and an undesirably low thermal expansion coefficient. The composite sintered body of Comparative Example 2, on the other hand, had the content of silicon nitride of not higher than 40 mole percent and thereby had no silicon nitride crystalline phases remain after sintering and an undesirably high thermal expansion coefficient.

The silicon nitride-melilite composite sintered bodys of Working Examples 7 to 19 had Si in a range of 41 to 79 mole percent in $Si_3N_4$ equivalent, Y in a range of 13 to 46 mole percent in oxide equivalent, and a group 2 element Sr in a range of 5 to 20 mole percent in oxide equivalent. The composite sintered bodys of these Working Examples had the more excellent sintering performance, compared with the composite sintered bodys of Working Examples 20 to 23 having the less content of Sr than 5 mole percent in oxide equivalent. The composite sintered bodys of Working Examples 7 to 19 all had the adequate average thermal expansion coefficient in the range of 2 to 6 ppm/K at the temperatures of 23 to 150° C., the high bending strength, and the high Young's modulus. The composite sintered bodys of Working Example 24 and 25 having the greater content of Sr than 20 mole percent in oxide equivalent had the decreasing tendencies of the Young's modulus and the mechanical strength.

The silicon nitride-melilite composite sintered bodys of Working Examples 26 to 37 had Si in a range of 45 to 83 mole percent in $Si_3N_4$ equivalent, Y in a range of 15 to 49 mole percent in oxide equivalent, and La in a range of 0.3 to 12 mole percent in oxide equivalent. The composite sintered bodys of these Working Examples had the more excellent sintering performance, compared with the composite sintered bodys of Working Examples 38 to 40 having the less content of La than 0.3 mole percent in oxide equivalent. The composite sintered bodys of Working Examples 26 to 37 all had the adequate average thermal expansion coefficient in the range of 2 to 6 ppm/K at the temperatures of 23 to 150° C., the high bending strength, and the high Young's modulus. The composite sintered body of Working Example 41 having the greater content of La than 12 mole percent in oxide equivalent and the composite sintered bodys of Working Examples 42 and 43 having the greater content of Ce than 12 mole percent in oxide equivalent had the increasing tendency of the thermal expansion coefficient and the decreasing tendency of the mechanical strength.

The silicon nitride-melilite composite sintered bodys of Working Examples 44 to 58 had Si in a range of 41 to 83 mole percent in $Si_3N_4$ equivalent, Y in a range of 13 to 49 mole percent in oxide equivalent, Sr in a range of 0 to 20 mole percent in oxide equivalent, and La or Ce in a range of 0 to 12 mole percent in oxide equivalent. The composite sintered bodys of these Working Examples also had the good sintering performance, the adequate average thermal expansion coefficient in the range of 2 to 6 ppm/K at the temperatures of 23 to 150° C., the high bending strength, and the high Young's modulus. Among these Working Examples, especially the composite sintered bodys of Working Examples 44 to 46 and 48 to 58 further containing Al as an additive in a range of 0.5 to 10 mole percent had the more stable sintering performance. The composite sintered body of Working Example 59 containing 15 mole percent of Al in oxide equivalent, however, had an undesirably high ratio of the other crystalline phases but the silicon nitride crystalline phases and the melilite crystalline phases and thereby the decreasing tendency of the Young's modulus.

As clearly shown in Table 5, the amount of surplus oxygen in a specific range assured the favorable sintering performance, but an excessive amount of surplus oxygen undesirably lowered the bending strength.

Among various Examples shown in Tables 1 through 5, in some Working Examples containing La or Ce as the additive, La or Ce may be replaced with Pr as the additive. In some Working Examples containing Sr as the additive, Sr may be replaced with Mg or Ca as the additive. Such modifications assure the similar effects to those of the corresponding Working Examples discussed above. In some Working Examples containing Al as the additive, Al may be replaced with at least one element selected among Al, Si, group 4 elements, group 5 elements, and group 6 elements as the additive. Such modification assures the similar effect of stabling the sintering performance to those of the corresponding Working Examples discussed above.

Other embodiments and applications of the invention are described below. In one preferable embodiment of the invention, the silicon nitride-melilite composite sintered body has a water absorption rate of not higher than 1.5%, and a sum of the ratio of the melilite crystalline phases and the ratio of the silicon nitride crystalline phases is not less than 80% on the cutting plane of the composite sintered body.

The silicon nitride-melilite composite sintered body according to the embodiment of the invention is a dense composite sintered body having the water absorption rate of not higher than 1.5%. The ratio of the melilite crystalline phases is not less than 20% on the cutting plane of the silicon nitride-melilite composite sintered body. The sum of the ratio of the melilite crystalline phases and the ratio of the silicon nitride crystalline phases is not less than 80% on the cutting plane of the composite sintered body. The silicon nitride-melilite composite sintered body of the embodiment accordingly has a sufficiently large ratio of the crystallized parts. The high density of the composite sintered body has a less decrease of the Young's modulus due to the presence of pores, while the crystallized parts contribute to increase the Young's modulus. The silicon nitride-melilite composite sintered body of the embodiment accordingly has the high Young's modulus.

The ratio of the silicon nitride crystalline phases and the ratio of the melilite crystalline phases may be determined by any of the techniques, electron probe microanalysis (EPMA), transmission electron microscopy (TEM), scanning electron microscopy (SEM), X-ray diffractometry (XRD), and energy dispersive X-ray spectroscopy (EDS). Etching the surface of the composite sintered body other than the crystallized parts (for example, plasma etching with $CF_4$ or chemical etching with hydrofluoric acid) allows for the more precise analyses.

In another preferable embodiment of the invention, the silicon nitride-melilite composite sintered body contains Si in a range of 41 to 83 mole percent in $Si_3N_4$ equivalent and Me in a range of 13 to 50 mole percent in oxide equivalent.

In the silicon nitride-melilite composite sintered body of the embodiment, the contents of Si and Me are regulated to the respective adequate ranges. This arrangement thus ensures the more precise adjustment of the thermal expansion coefficient.

In still another preferable embodiment of the invention, the silicon nitride-melilite composite sintered body contains Si in a range of 41 to 79 mole percent in $Si_3N_4$ equivalent, Me in a range of 13 to 46 mole percent in oxide equivalent, and a group 2 element as an additive in a range of 5 to 20 mole percent in oxide equivalent.

The silicon nitride-melilite composite sintered body of the embodiment has the desirable composition for the enhanced sintering performance. The adequate content of the group 2 element as the additive allows for production of the composite sintered body by firing at ordinary pressure, as well as by sintering under a pressurizing condition, for example, gas pressure firing, hot isostatic pressing, or hot pressing. This arrangement accordingly has the industrial advantages, for example, the reduced restrictions on the dimensions and the shape of the resulting composite sintered body and the lowered manufacturing cost by large scale production.

In the silicon nitride-melilite composite sintered body of the above embodiment containing Si in the range of 41 to 79 mole percent in $Si_3N_4$ equivalent, Me in the range of 13 to 46 mole percent in oxide equivalent, and the group 2 element as the additive in the range of 5 to 20 mole percent in oxide equivalent, the additive may be at least one element selected among Mg, Ca, and Sr.

The silicon nitride-melilite composite sintered body of the embodiment contains the favorable additive for the enhanced sintering performance. This arrangement assures the more stable production of the silicon nitride-melilite composite sintered body having the sufficiently high Young's modulus of not lower than 200 GPa and the average thermal expansion coefficient arbitrarily adjustable in the range of 2 to 6 ppm/K at the temperatures of 23 to 150° C.

In the silicon nitride-melilite composite sintered body of the above embodiment, the additive may be Sr.

The silicon nitride-melilite composite sintered body of the embodiment contains the most favorable additive for the further enhanced sintering performance. This arrangement assures the more stable production of the silicon nitride-melilite composite sintered body having the sufficiently high Young's modulus of not lower than 200 GPa and the average thermal expansion coefficient arbitrarily adjustable in the range of 2 to 6 ppm/K at the temperatures of 23 to 150° C.

The group 2 element Mg, Ca, or Sr added in the form of an oxide (for example, SrO) tends to react with the water content and produce a hydroxide (for example, $Sr(OH)_2$) in the manufacturing process. The group 2 element Mg, Ca, or Sr is accordingly added in the form of a carbonate (for example, $SrCO_3$). The thermal stability of the carbonates of these group 2 elements increases in the order of Mg<Ca<Sr. This proves that Sr is especially preferable for the stable production of the silicon nitride-melilite composite sintered body.

The silicon nitride-melilite composite sintered body of the above embodiment containing Si in the range of 41 to 79 mole percent in $Si_3N_4$ equivalent, Me in the range of 13 to 46 mole percent in oxide equivalent, and the group 2 element as the additive in the range of 5 to 20 mole percent in oxide equivalent may further contain at least one element selected among Al, Si, group 4 elements, group 5 elements, and group 6 elements, as an additive.

Addition of at least one element selected among Al, Si, the group 4 elements, the group 5 elements, and the group 6 elements as the additive assures the more stable sintering performance of the resulting composite sintered body. Addition of a transition metal, such as W or Mo, blackens the resulting composite sintered body and thus effectively reduces the potential for uneven color of the resulting composite sintered body. In one modification, the silicon nitride-melilite composite sintered body may further contain at least one element selected among group 7 elements and group 8 elements as an additive.

In one preferable application of the above embodiment, the silicon nitride-melilite composite sintered body further contains Al in a range of 0.5 to 10 mole percent in oxide equivalent.

The silicon nitride-melilite composite sintered body of this application contains the adequate content of the favorable additive for the more stable sintering performance. For example, the content of $Al_2O_3$ of not higher than 0.5 mole percent does not have any significant effects. The content of $Al_2O_3$ in the range of 0.5 to 10 mole percent in oxide equivalent, however, desirably lowers the sintering temperature without having any adverse effects on the other properties, thus assuring the more stable sintering performance.

In another preferable embodiment of the invention, the silicon nitride-melilite composite sintered body contains Si in a range of 45 to 83 mole percent in $Si_3N_4$ equivalent, Me in a range of 15 to 49 mole percent in oxide equivalent, and at least one element selected among La, Ce, and Pr as an additive in a range of 0.3 to 12 mole percent in oxide equivalent.

The silicon nitride-melilite composite sintered body of the embodiment has the desirable composition for the enhanced sintering performance. The adequate content of at least one element selected among La, Ce, and Pr as the additive allows for production of the composite sintered body by firing at ordinary pressure, as well as by sintering under a pressuring condition, for example, gas pressure firing, hot isostatic pressing, or hot pressing. This arrangement accordingly has the industrial advantages, for example, the reduced restrictions on the dimensions and the shape of the resulting composite sintered body and the lowered manufacturing cost by large scale production. This arrangement also assures the stable production of the silicon nitride-melilite composite sintered body having the sufficiently high Young's modulus of not lower than 200 GPa and the average thermal expansion coefficient arbitrarily adjustable in the range of 2 to 6 ppm/K at the temperatures of 23 to 150° C.

In one preferable embodiment of the silicon nitride-melilite composite sintered body according to the above aspect of the invention, Me is a group 3 element.

The silicon nitride-melilite composite sintered body of the embodiment has the favorable metal element Me.

In one preferable application of the silicon nitride-melilite composite sintered body of the above embodiment, Me is Y.

The silicon nitride-melilite composite sintered body of this application has the most favorable metal element Me that combines with silicon nitride to generate the melilite. Yttrium is readily combined with silicon nitride to form the melilite and is readily available. This arrangement assures the easy and stable production of the silicon nitride-melilite composite sintered body having the sufficiently high Young's modulus of not lower than 200 GPa and the average thermal expansion coefficient arbitrarily adjustable in the range of 2 to 6 ppm/K at the temperatures of 23 to 150° C., while effectively reducing the manufacturing cost.

In another preferable embodiment of the silicon nitride-melilite composite sintered body according to the above aspect of the invention, a main peak diffraction intensity 'a' of the silicon nitride and a main peak diffraction intensity 'b' of the melilite observed by X-ray diffractometry of the silicon nitride-melilite composite sintered body satisfy a relation of:

$$50 \leq [b/(a+b)] \times 100 \leq 98.$$

The main peak diffraction intensity 'a' of the silicon nitride represents a diffraction intensity of a highest peak among all the peaks of the silicon nitride. The main peak diffraction intensity 'b' of the melilite represents a diffraction intensity of a highest peak among all the peaks of the melilite.

This arrangement assures the stable production of the silicon nitride-melilite composite sintered body having the sufficiently high Young's modulus of not lower than 200 GPa and the average thermal expansion coefficient arbitrarily adjustable in the range of 2 to 6 ppm/K at the temperatures of 23 to 150° C.

In one preferable embodiment of the invention, the silicon nitride-melilite composite sintered body has the average thermal expansion coefficient in the range of 2 to 6 ppm/K at the temperatures of 23 to 150° C.

This arrangement assures the production of the silicon nitride-melilite composite sintered body having the average thermal expansion coefficient arbitrarily adjustable in the range of 2 to 6 ppm/K at the temperatures of 23 to 150° C.

In another preferable embodiment of the invention, the silicon nitride-melilite composite sintered body has the Young's modulus of not lower than 200 GPa.

This arrangement assures the production of the silicon nitride-melilite composite sintered body having the sufficiently high Young's modulus of not lower than 200 GPa.

In the silicon nitride-melilite composite sintered body of the invention having a fixed composition, the strength of the material and the Young's modulus may be increased by regulation of the microstructure.

The main factors affecting the microstructure include the particle diameter of the material, the amount of the additive, the amount of the material oxygen, and the firing temperature. FIGS. 5A through 5D are electron micrographs at a 3000-fold magnification by SEM imaging of silicon nitride-melilite composite sintered bodys having a fixed composition but different microstructures. The values under the respective electron micrographs show the bending strengths of the respective composite sintered bodys measured at room temperature (23° C.) in conformity with JIS R 1601. As clearly shown in these electron micrographs, the fineness of the microstructures of the composite sintered bodys increases in the order of FIG. 5A, FIG. 5B, FIG. 5C, and FIG. 5D. The bending strength of the composite sintered bodys also increases in this order, that is, with an increase in fineness of the microstructures of the composite sintered bodys.

The silicon nitride-melilite composite sintered body according to the above aspect of the invention may have an amount of surplus oxygen in a range of 2 to 16 mole percent in $SiO_2$ equivalent.

The amount of surplus oxygen represents a residual amount of oxygen calculated by subtracting an amount of oxygen belonging to the components other than Si from the total amount of oxygen contained in the whole composite sintered body. The surplus oxygen is mainly from oxygen included in the silicon nitride and oxygen included in the additives and may be additionally from oxygen adsorbed in the manufacturing process or from oxygen of $SiO_2$ added as an oxygen source. The surplus oxygen is basically present in the form of $SiO_2$. The amount of surplus oxygen of lower than 2 mole percent in $SiO_2$ equivalent causes the poor sintering performance. The amount of surplus oxygen of higher than 16 mole percent in $SiO_2$ equivalent, on the other hand, causes aggregation of the melilite and the silicon nitride. Such aggregates of the melilite and the silicon nitride may work as the origin of the fracture, so that the composite sintered body having the excessive amount of surplus oxygen has the undesirably lowered mechanical strength.

Other crystalline phases but the silicon nitride crystalline phases and the melilite crystalline phases may be generated according to the content of the additive or according to the amount of surplus oxygen. For example, an excessive amount of SrO generates crystalline phases of, for example, $SrSiO_3$ and $Sr_2SiO_4$. An excessive amount of surplus oxygen generates crystalline phases of, for example, $Y_{20}Si_{12}O_{48}N_4$. Other examples of crystalline phases of, for example, $Y_2SiO_5$, $Y_2Si_2O_7$, $Y_4Si_2O_7N_2$ (J phases), $YSiO_2N$ (K phases), and $Y_{10}Si_7O_{23}N_4$ (H phases) may also be generated according to the firing conditions or according to some influence factors in the manufacturing process.

The device according to another aspect of the invention may be a probe card.

The probe card is used to inspect integrated circuits formed on semiconductor wafers with the high reliability. The silicon nitride-melilite composite sintered body of the invention is the more favorable material than the conventional ceramic material made of a single component (for example, alumina, aluminum nitride, silicon carbide, or silicon nitride). The silicon nitride-melilite composite sintered body of the invention has the thermal expansion coefficient arbitrarily adjustable in some adequate range to be sufficiently closer to the required level of thermal expansion characteristic for the probe card used for inspection of semiconductor wafers. The semiconductor inspection device of the invention utilizing the silicon nitride-melilite composite sintered body of the invention thus assures inspection of semiconductor wafers with the high reliability.

While the invention has been described with reference to preferred exemplary embodiments thereof, it is to be understood that the invention is not limited to the disclosed embodiments or constructions. On the contrary, the invention is intended to cover various modifications and equivalent arrangements. In addition, while the various elements of the disclosed invention are shown in various combinations and configurations, which are exemplary, other combinations and configurations, including more less or only a single element, are also within the spirit and scope of the invention.

What is claimed is:

1. A silicon nitride-melilite composite sintered body comprising:
   silicon nitride crystalline phases;
   melilite crystalline phases of $Me_2Si_3O_3N_4$; where 'Me' denotes a metal element combining with silicon nitride to generate a melilite; and
   grain boundary phases,
   wherein the melilite crystalline phases account for not less than 20 area percent on a cutting plane of the silicon nitride-melilite composite sintered body,
   wherein the silicon nitride-melilite composite sintered body contains Si in a range of 41 to 83 mole percent in $Si_3N_4$ equivalent and Me in a range of 13 to 50 mole percent in oxide equivalent.

2. The silicon nitride-melilite composite sintered body in accordance with claim 1, wherein the silicon nitride-melilite composite sintered body has a water absorption rate of not higher than 1.5%,
   wherein a sum of the melilite crystalline phases and the silicon nitride crystalline phases account for not less than 80 area percent on the cutting plane.

3. The silicon nitride-melilite composite sintered body in accordance with claim 1, wherein Me is a group 3 element.

4. The silicon nitride-melilite composite sintered body in accordance with claim 3, wherein Me is Y.

5. The silicon nitride-melilite composite sintered body in accordance with claim 1, wherein a main peak diffraction intensity 'a' of the silicon nitride and a main peak diffraction intensity 'b' of the melilite observed by X-ray diffractometry of the silicon nitride-melilite composite sintered body satisfy a relation of:

$$50 \leq [b/(a+b)] \times 100 \leq 98.$$

6. The silicon nitride-melilite composite sintered body in accordance with claim 1, wherein the silicon nitride-melilite composite sintered body has an average thermal expansion coefficient in a range of 2 to 6 ppm/K at temperatures of 23 to 150° C.

7. The silicon nitride-melilite composite sintered body in accordance with claim 1, wherein the silicon nitride-melilite composite sintered body has a Young's modulus of not lower than 200 GPa.

8. A device used for inspection or production of semiconductor, the device being a probe card including a substrate comprising a silicon nitride-melilite composite sintered body and a plurality of probe terminals provided on a face of the substrate, wherein
   the silicon nitride-melilite composite sintered body comprises silicon nitride crystalline phases;
   melilite crystalline phases of $Me_2Si_3O_3N_4$; where 'Me' denotes a metal element combining with silicon nitride to generate a melilite; and
   grain boundary phases,
   wherein the melilite crystalline phases account for not less than 20 area percent on a cutting plane of the silicon nitride-melilite composite sintered body.

9. A silicon nitride-melilite composite sintered body comprising: silicon nitride crystalline phases;
   melilite crystalline phases of $Me_2Si_3O_3N_4$; where 'Me' denotes a metal element combining with silicon nitride to generate a melilite; and grain boundary phases, wherein the melilite crystalline phases account for not less than 20 area percent on a cutting plane of the silicon nitride-melilite composite sintered body, and wherein the silicon nitride-melilite composite sintered body contains Si in an range of 41 to 79 mole percent in $Si_3N_4$ equivalent, Me in a range of 13 to 46 mole percent in oxide equivalent, and a group 2 element as an additive in a range of 5 to 20 mole percent in oxide equivalent.

10. The silicon nitride-melilite composite sintered body in accordance with claim 9, wherein the additive is at least one element selected among Mg, Ca, and Sr.

11. The silicon nitride-melilite composite sintered body in accordance with claim 9, wherein the additive is Sr.

12. The silicon nitride-melilite composite sintered body in accordance with claim 9, wherein the silicon nitride-melilite composite sintered body further contains at least one element selected among Al, Si, group 4 elements, group 5 elements, and group 6 elements, as an additive.

13. The silicon nitride-melilite composite sintered body in accordance with claim 9, wherein the silicon nitride-melilite composite sintered body contains Al in a range of 0.5 to 10 mole percent in oxide equivalent.

14. A silicon nitride-melilite composite sintered body comprising:

silicon nitride crystalline phases;

melilite crystalline phases of $Me_2Si_3O_3N_4$; where 'Me' denotes a metal element combining with silicon nitride to generate a melilite; and grain boundary phases, wherein the melilite crystalline phases account for not less than 20 area percent on a cutting plane of the silicon nitride-melilite composite sintered body, and wherein the silicon nitride-melilite composite sintered body contains Si in an range of 45 to 83 mole percent in $Si_3N_4$ equivalent, Me in a range of 15 to 49 mole percent in oxide equivalent, and at least one element selected among La, Ce and Pr as an additive in a range of 0.3 to 12 mole percent in oxide equivalent.

* * * * *